United States Patent
Mei et al.

(10) Patent No.: US 9,606,771 B2
(45) Date of Patent: Mar. 28, 2017

(54) TRUE RANDOM NUMBER GENERATOR WITH REPEATEDLY ACTIVATED OSCILLATOR

(71) Applicants: Wangsheng Mei, Suzhou (CN); Yang Wang, Suzhou (CN); Jianzhou Wu, Suzhou (CN); Yan Xiao, Suzhou (CN)

(72) Inventors: Wangsheng Mei, Suzhou (CN); Yang Wang, Suzhou (CN); Jianzhou Wu, Suzhou (CN); Yan Xiao, Suzhou (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 373 days.

(21) Appl. No.: 14/461,445

(22) Filed: Aug. 18, 2014

(65) Prior Publication Data

US 2015/0106415 A1    Apr. 16, 2015

(30) Foreign Application Priority Data

Oct. 15, 2013   (CN) .......................... 2013 1 0481382

(51) Int. Cl.
G06F 7/58     (2006.01)
H03K 3/03     (2006.01)
H03K 3/84     (2006.01)

(52) U.S. Cl.
CPC .......... *G06F 7/588* (2013.01); *H03K 3/0315* (2013.01); *H03K 3/84* (2013.01)

(58) Field of Classification Search
CPC ......... G06F 7/588; H03K 3/0315; H03K 3/84
USPC .................................................. 708/250–256
See application file for complete search history.

(56) References Cited

U.S. PATENT DOCUMENTS

| | | | |
|---|---|---|---|
| 5,963,104 A * | 10/1999 | Buer ....................... | G06F 7/588 708/250 |
| 6,807,553 B2 | 10/2004 | Oerlemans | |
| 7,502,815 B1 | 3/2009 | Drimer | |
| 8,131,789 B2 | 3/2012 | Vergnes et al. | |
| 8,150,900 B2 * | 4/2012 | Golic ....................... | G06F 7/584 708/250 |
| 8,321,773 B1 | 11/2012 | Pedersen | |
| 2002/0156819 A1 * | 10/2002 | Oerlemans ............ | H04L 9/0861 708/252 |
| 2006/0069706 A1 * | 3/2006 | Lazich .................... | G06F 7/588 708/251 |
| 2006/0173943 A1 * | 8/2006 | Luzzi ...................... | G06F 7/588 708/250 |
| 2007/0244950 A1 * | 10/2007 | Golic ....................... | G06F 7/582 708/250 |
| 2009/0077147 A1 * | 3/2009 | Hars ....................... | H04L 9/0861 708/251 |
| 2011/0128081 A1 | 6/2011 | Hars | |
| 2012/0213358 A1 | 8/2012 | Dror | |

* cited by examiner

*Primary Examiner* — Tan V. Mai
(74) *Attorney, Agent, or Firm* — Charles E. Bergere

(57) ABSTRACT

A true random number generator (RNG) has one or more oscillators and an output register for storing a random number output. Each of the oscillators is activated, successively, in a free-running oscillation phase, and a capture phase during which the oscillator is quiescent. The output register latches during the capture phase of each oscillator an end state of that oscillator at or close to the end of its oscillation phase. The random number output is derived from the latched end states.

20 Claims, 5 Drawing Sheets

TRUE RANDOM NUMBER GENERATOR WITH REPEATEDLY ACTIVATED OSCILLATOR

BACKGROUND OF THE INVENTION

The present invention is directed to digital circuits and, more particularly, to a random number generator with one or more repeatedly activated oscillators.

Random number generators (RNGs) are frequently needed in processors and other electronic devices, especially those that use encryption or other security applications, where the random number is used for example as an encryption key. The expression true random numbers refers to non-deterministic numbers or sequences of numbers that are sufficiently unpredictable for the purposes for which they are used. A pseudorandom number generator (PRNG), on the other hand, generates number sequences that exhibit sufficient statistical randomness for some purposes but are generated by a process that is deterministic and may even be repeated precisely, such as for test purposes.

The use of random numbers in many applications, especially encryption or other security applications, requires a high degree of statistical randomness and protection from attack for which a PRNG is insufficiently truly random. A true random number generator (TRNG) is the expression used for number generation that is unpredictable, at least in theory. Physical phenomena are often used in hardware TRNGs by an analog module that generates a random bit stream using a physical noise source, such as thermal noise, photoelectric effects or atomic quantum phenomena. However, it is often costly and inconvenient to incorporate the analog sensors for such phenomena, with associated analog amplifiers and analog-to-digital converters (ADCs), in processor units that are essentially digital.

Conventional pure digital RNGs are often deterministic, therefore are not TRNGs, and thus are easier to attack. The present invention provides a TRNG are that uses simple logic circuit elements, has low power consumption and is compatible with digital data processors.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF THE INVENTION

Figure 1:
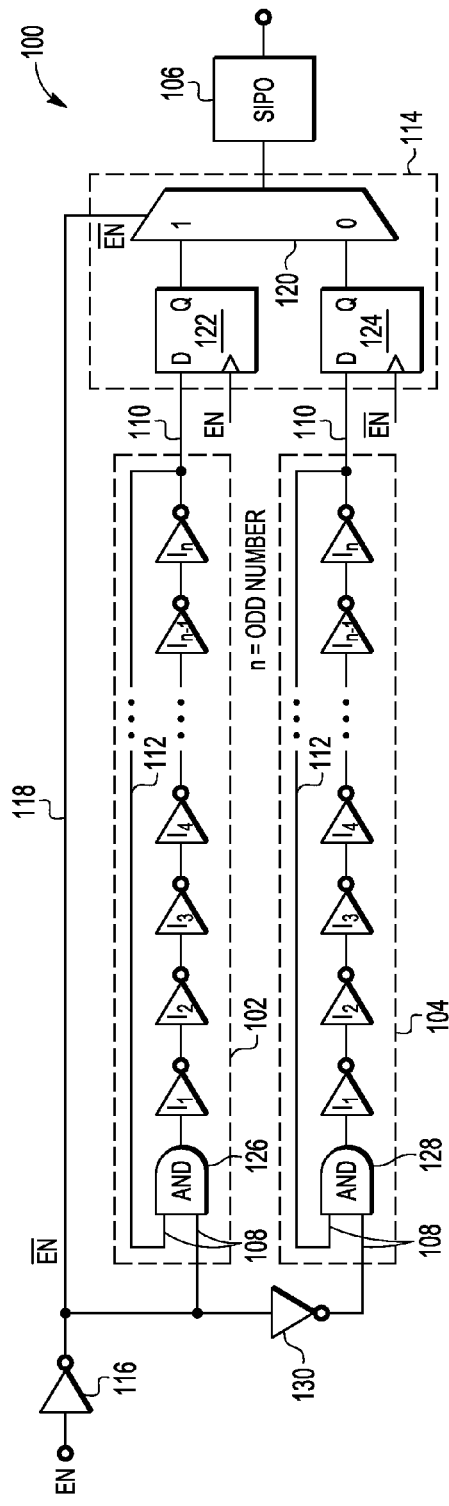
FIG. 1 is a schematic block diagram of a true random number generator (TRNG) in accordance with one embodiment of the present invention.

Referring now to FIG. 1, a true random number generator (TRNG) 100 in accordance with an embodiment of the present invention is shown. The TRNG 100 includes a pair of oscillators 102, 104 and an output register 106 for storing a random number output. The oscillators 102, 104 each comprise a ring oscillator having an odd number n of inverters $I_1$ to $I_n$ connected in series between an oscillator input 108 and an oscillator output 110. There is a feedback loop 112 from the oscillator output 110 to the oscillator input 108.

As will be described in more detail below, each of the oscillators 102, 104 is activated in, successively, a free-running oscillation phase, and in a capture phase during which the oscillator is quiescent. The output register 106 latches during the capture phase of each oscillator 102 or 104 in succession an end state of that oscillator at or close to the end of its oscillation phase. A random number output then is derived from the latched end states.

The inverters $I_1$ to $I_n$ may be tri-state inverters that switch between asserted and de-asserted output states during the oscillation phase, and have a high impedance output during the capture phase. Such tri-state inverters have a low leakage current, which reduces the current consumption of the TRNGs.

A control signal EN is used to control the oscillation phases and the capture phases of the oscillators 102, 104. A signal processor 114 is controlled by the control signal EN for latching the end states of the oscillators 102, 104 and applying selected end states to the output register 106. In the embodiment shown, the output register 106 is a serial-input register. The signal processor 114 applies the latched end states of the oscillators 102, 104 to the output register 106, serially. That is, the signal processor 114 applies the latched end states of the oscillators 102, 104 alternately to the output register 106.

The control signal EN is generated by a controller (not shown) that is external to the TRNG 100. The control signal EN is inverted by an inverter 116 to produce the control signal /EN.

The signal processor 114 comprises a multiplexer or mux 120 and a pair of D flip-flops 122 and 124. The inverted control signal /EN is applied by way of a line 118 to control the selection of signals at the inputs of the mux 120. The outputs 110 of the oscillators 102, 104 are connected to the D input of the flip-flops 122 and 124 respectively, and the Q outputs of the D flip-flops 122, 124 are connected to respective inputs of the mux 120. The control signal EN is applied to a trigger input of the flip-flop 122 and the control signal /EN is applied to a trigger input of the flip-flop 124.

The feedback loop 112 of the oscillator 102 includes an input of an AND gate 126 whose other input receives the control signal /EN. The oscillator 102 starts oscillating at the beginning of its oscillation phase when the control signal /EN and the feedback signal from the output 110 of the oscillator (including noise), are both asserted on the inputs of the AND gate 126. The oscillator 102 stops oscillating, and enters its capture phase, when the control signal /EN is de-asserted. Due to the delay introduced by the inverter 116, the control signal EN triggers the flip-flop 122 to latch the output signal of the oscillator 102 just before the oscillation of the oscillator 102 starts to subside at the end of its oscillation phase. The feedback loop 112 of the oscillator 104 similarly includes an AND gate 128 with a first input receiving the oscillator 104 feedback signal 112 and the other input receiving a control signal derived from the control signal /EN.

To ensure that the control signal /EN is applied to the trigger input of the flip-flop 124 before the oscillation of the oscillator 104 starts to subside at the end of its oscillation phase, the control signal applied to the trigger input of the flip-flop 124 is an output signal from a further inverter 130, which introduces a further delay relative to the original control signal EN. The control signal /EN applied to the mux 120 by way of the line 118 ensures that the mux 120 selects the output of the flip-flop 122 or 124 whose oscillator 102 or 104 is in its capture phase. The output of the mux 120 is applied to the input of a single-input, parallel-output (SIPO) output register 106 that produces the TRN as a parallel output, in this example, although it will be appreciated that any other suitable configuration of output register may be provided.

Figure 2:
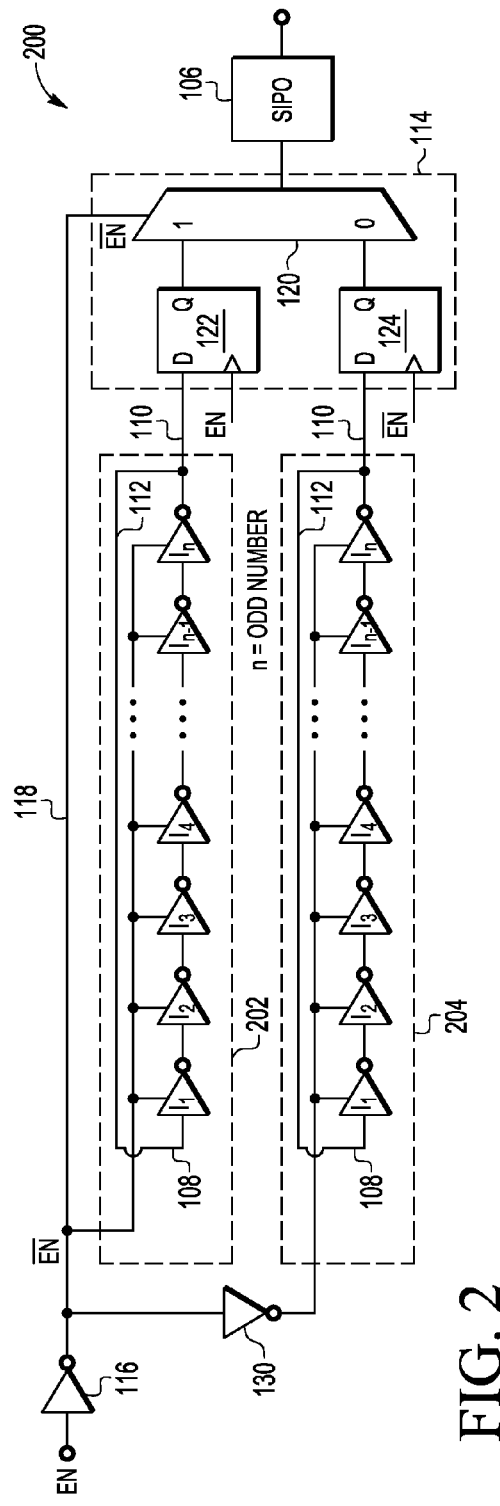
FIG. 2 is a schematic block diagram of a TRNG in accordance with another embodiment of the present invention.

Referring now to FIG. 2, another embodiment of a TRNG 200 in accordance with the present invention is shown. The TRNG 200 includes a pair of oscillators 202, 204, the output register 106 and the signal processor 114. The feedback loops 112 of the oscillators 202 and 204 are connected directly to the inputs of the first inverters $I_1$ at the oscillator inputs. The inverters $I_1$ to $I_n$ of the oscillator 202 and 204 have control inputs connected to the outputs of the inverters 116 and 130. When the control signal /EN, or the output of the inverter 130, is asserted the inverters $I_1$ to $I_n$ of the oscillator 202, or 204, are activated and the oscillator 202 or 204 starts its oscillation phase. Conversely, when the control signal /EN, or the output of the inverter 130, is de-asserted the inverters $I_1$ to $I_n$ of the oscillator 202, or 204, are de-activated (high impedance) and the oscillation of the oscillator 202 or 204 terminates.

The oscillation frequency of the oscillators 102, 104 and 202, 204 is a function of the number of inverters $I_1$ to $I_n$ and of the individual delay introduced by each inverter, which is a function of the component capacitances, especially the gate capacitance, and of process, voltage and temperature (PVT) parameters. The repetition rate of the control signals EN, /EN is not correlated with the oscillation frequency of the oscillators 102, 104 and 202, 204. It will be understood that the repetition rate of the control signals EN, /EN should leave sufficient settling time for the oscillation and capture phases of the oscillators 102, 104 and 202, 204. It will be appreciated that, although the frequency of each ring oscillator 102, 104 and 202, 204 is determined by physical parameters such as the delays introduced by its string of inverters $I_1$ to $I_n$ its start-up time and phase and its oscillating shape are completely determined by the noise introduced by the system's power supply, which is truly random.

Figure 3:
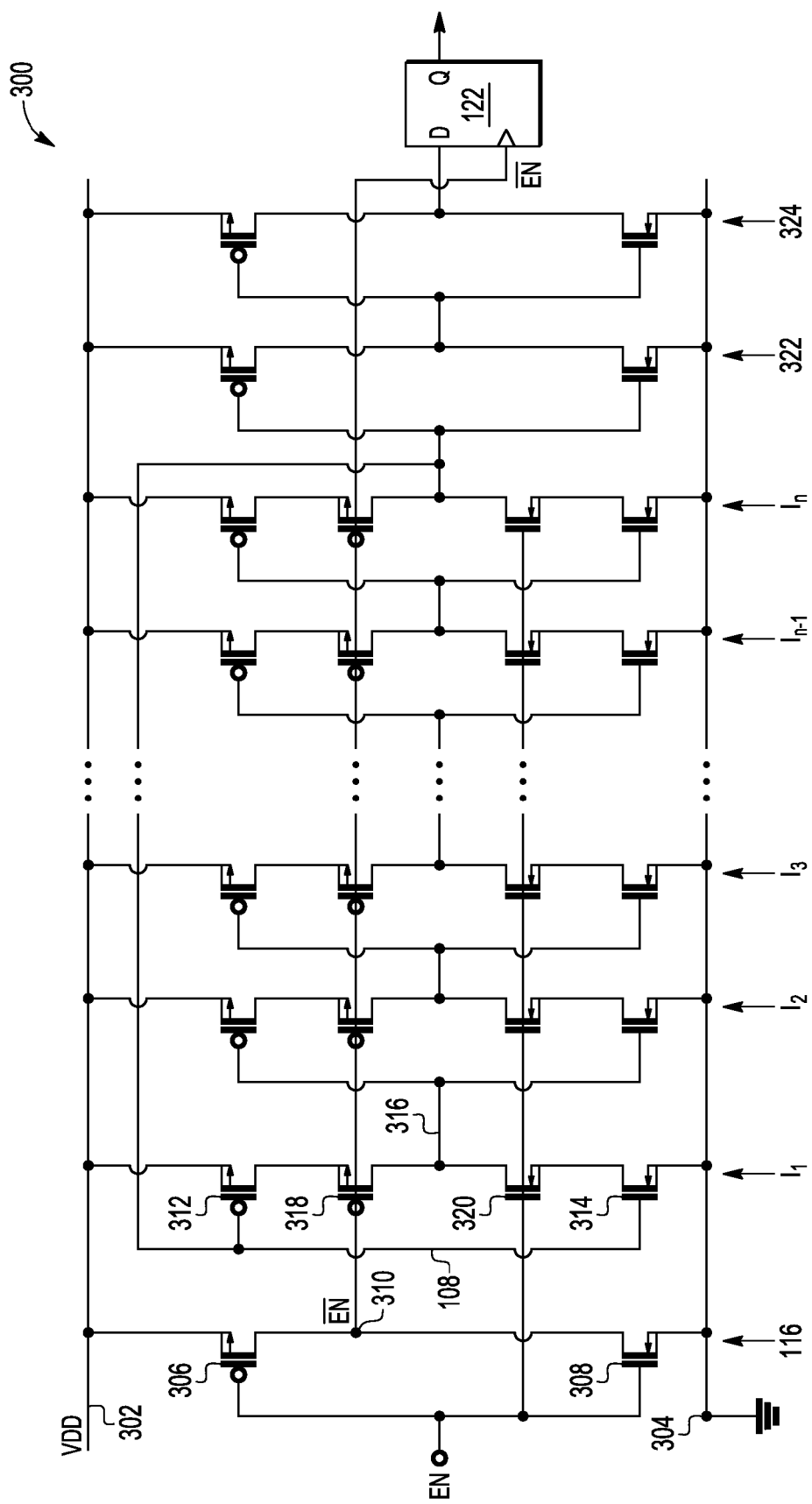
FIG. 3 is a schematic circuit diagram of a ring oscillator used in a TRNG in accordance with an embodiment of the present invention.

FIG. 3 shows a ring oscillator 300 that may be used in a TRNG in accordance with an embodiment of the invention. More particularly, the ring oscillator 300 is similar to the oscillator 202 but uses differential inverters $I_1$ to $I_n$. It will be understood that the oscillator 204 may be similar to the oscillator 300 but with the control signals EN, /EN inverted. The oscillator 300 has a power supply bus 302 receiving a voltage /VDD and ground 304. The inverter 116 has a pair of metal-oxide semiconductor field-effect transistors (MOSFETs) 306 and 308, respectively p-type and n-type, whose gates are connected to receive the control signal EN. The source of the MOSFET 306 is connected to the power supply bus 302 and its drain is connected to a node 310. The source of the MOSFET 308 is connected to ground 304 and its drain is connected to the node 310. The output of the inverter 116 of the oscillator 300 is the control signal EN.

The inverters $I_1$ to $I_n$ are all similar and each have a first pair of MOSFETs 312 and 314, respectively p-type and n-type, whose gates are connected to receive as input signal the output signal from an output node 316 of the previous inverter in the series $I_1$ to $I_n$, apart from the first inverter $I_1$, whose MOSFETs 312 and 314 have their gates connected to the input 108 of the oscillator 300 to receive as input the feedback signal from the feedback loop 112. The sources of the MOSFETs 312 are connected to the power supply bus 302 and the sources of the MOSFETs 314 are connected to ground 304. The inverters $I_1$ to $I_n$ also each have a second pair of MOSFETs 318 and 320, respectively p-type and n-type, whose gates are connected to receive the control signals /EN, EN, respectively. The source-drain paths of the MOSFETs 318 and 320 are connected between the output node 316 of the same inverter and the drains of the inverter's MOSFETs 312 and 314 respectively. The output 110 of the oscillator 300 is passed to the D input of the flip-flop 122 through a pulse-shaping circuit with two inverters 322 and 324 in series, the inverters 322 and 324 having pairs of MOSFETs similar to the MOSFETs 306 and 308.

Figure 5:
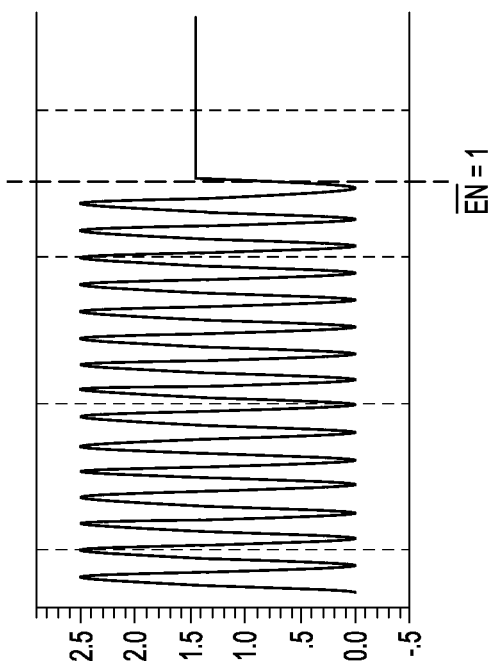
FIGS. 4 and 5 are graphs of signals appearing in operation of the ring oscillator of FIG. 3.
Figure 4:
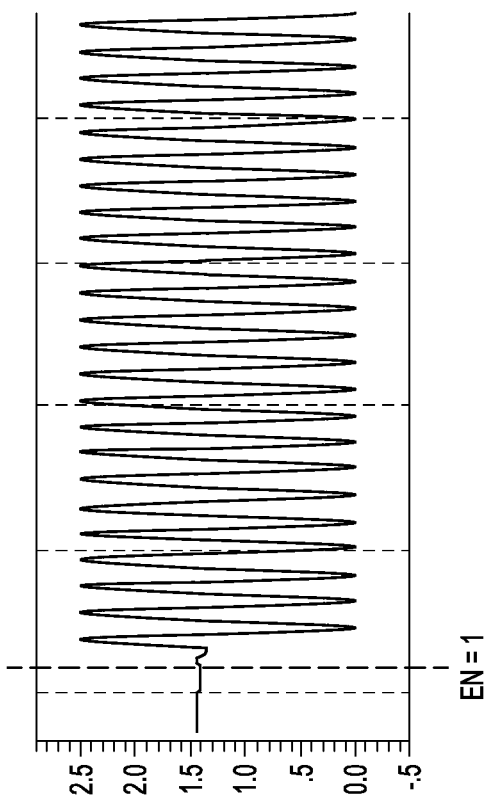
Figure 6:
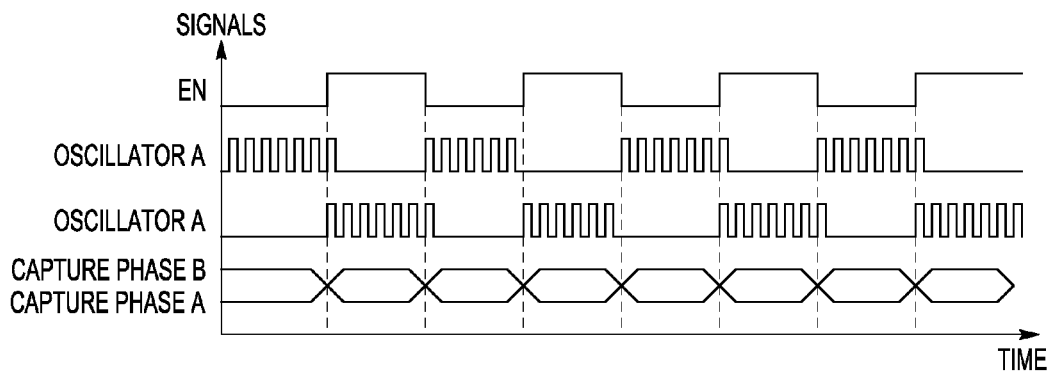
FIG. 6 is a wave-form diagram of signals appearing in operation of a TRNG in accordance with an embodiment of the present invention.

An example of wave-forms obtained at the start and end of the oscillation phase of the oscillator 300 are shown in FIGS. 4 to 6. Initially, as shown in FIG. 4, the control signal EN is de-asserted (ground). The second pairs of MOSFETs 318 and 320 are turned OFF, the inverters $I_1$ to $I_n$ of the oscillator 300 are de-activated (high impedance) and the oscillator 300 is quiescent, with the voltage of the output 110, the feedback loop 112 and the input 108 balanced at a stable intermediate voltage between VDD and ground, with low leakage current. When the control signal EN is asserted, the second pairs of MOSFETs 318 and 320 are turned ON and parasitic noise, coupled from either or both of the supply bus 302 and ground, causes one of the MOSFETs 312 and 314 of each of the first pairs to turn ON, the other staying OFF. The change of state of the first inverter $I_1$ occurs at random in either direction as a function of the noise voltage, and with a delay after the assertion of the control signal that is also determined by the noise voltage.

Towards the end of the oscillation phase, as shown in FIG. 5, the control signal EN is initially asserted (VDD). The second pairs of MOSFETs 318 and 320 are ON, the inverters $I_1$ to $I_n$ of the oscillator 300 are activated and the oscillator 300 is oscillating. When the control signal EN is de-asserted (ground), the second pairs of MOSFETs 318 and 320 are turned OFF, the oscillation rapidly subsides, and the oscillator 300 resumes its quiescent state during the capture phase.

The corresponding successive phases are illustrated in FIG. 6 for a repetitive cycle of the control signal EN in a TRNG having a pair of ring oscillators A and B.

Figure 7:
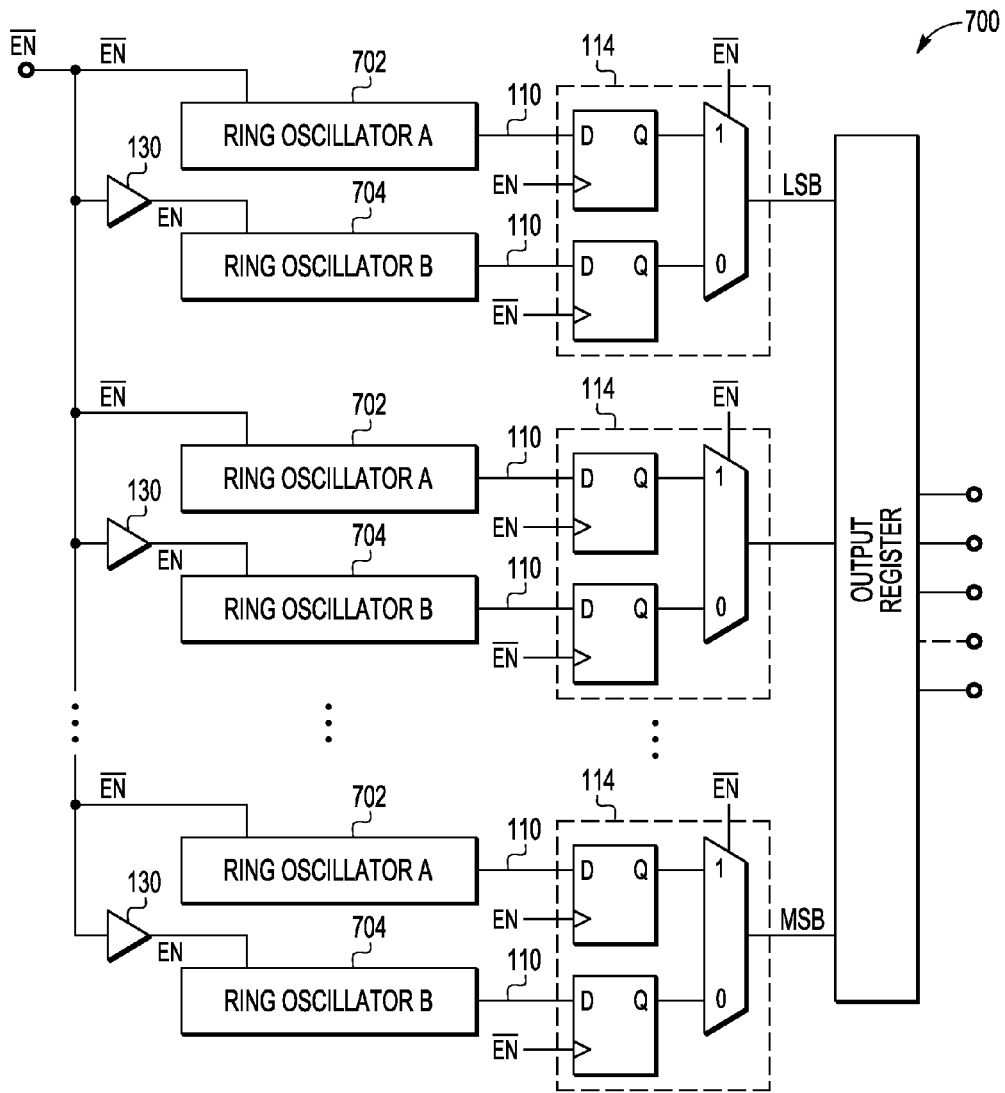
FIG. 7 is a schematic block diagram of a TRNG in accordance with yet another embodiment of the present invention.

In the configuration illustrated in FIG. 7, the TRNG 700 has a plurality of pairs of the oscillators 702, 704, an output register 706, and signal processors 114. The output register 706 is a parallel-input register having a plurality of inputs, whose outputs are connected in parallel to the inputs of the parallel-input register 706. The inputs of the parallel-input register 706 may constitute the least-significant bits (LSB) to most-significant bits (MSB) of a multi-bit binary random number output. The signal processor 114 applies the latched end states of the oscillators 702, 704 in parallel to the inputs of the register 706. The TRNG 700 may have a plurality of pairs of the oscillators 702, 704, and the signal processor 114 applies the latched end states of the oscillators of each pair alternately to the respective parallel inputs of the register 706.

The TRNGs 100, 200 and 700 have pairs of oscillators 102, 104, 202, 204 and 702, 704. The alternating operation of a pair of oscillators in which one is in the oscillating phase while the other is in the capture phase is known as ping-pong operation. With a pair of the oscillators, one oscillator can be always in the oscillation state while the other is in the capture state.

Figure 8:
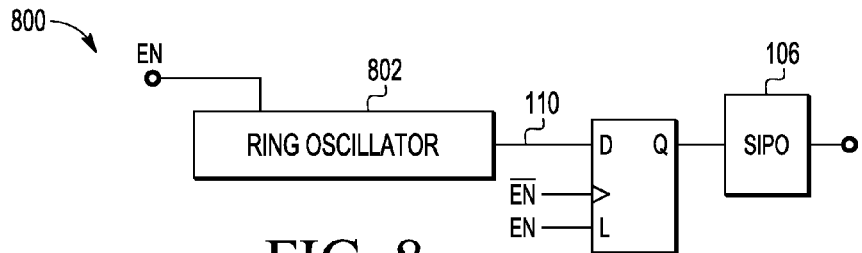
FIG. 8 is a schematic block diagram of a TRNG in accordance with yet another embodiment of the present invention.
Figure 9:
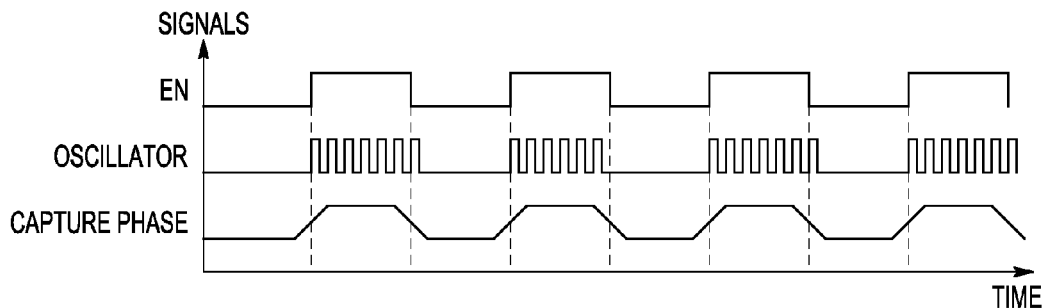
FIG. 9 is a wave-form diagram of signals appearing in operation of the TRNG of FIG. 8.

However, it will be appreciated that the oscillators 102, 104, 202, 204, 300 and 702, 704 are not necessarily associated in pairs. FIG. 8 illustrates a TRNG 800 having only a single ring oscillator 802, and FIG. 9 illustrates waveforms appearing in operation of the TRNG 800. Since there is only a single oscillator, the generation of random number output is slower but the circuit is simpler.

In other embodiments of the invention, the TRNG may have three or more of the oscillators. Such a configuration can offer random number generation at a faster rate. For example, it is possible to generate a 16-bit random number at a rate of 200 MHz using sixteen pairs of ring oscillators controlled by a control signal at 100 MHz. If there are an odd number of the oscillators, more oscillators can be simultaneously in the capture phase or in the oscillation phase than in the opposite phase, which may suit configurations where the settling time for the start of oscillation is different from the halt of oscillation.

The TRNGs 100, 200, 700 and 800 can be formed using only digital circuit elements, facilitating their incorporation in digital systems, and avoiding the cost and inconvenience of adding analog sensors with associated analog amplifiers and analog-to-digital converters ADCs.

Figure 10:
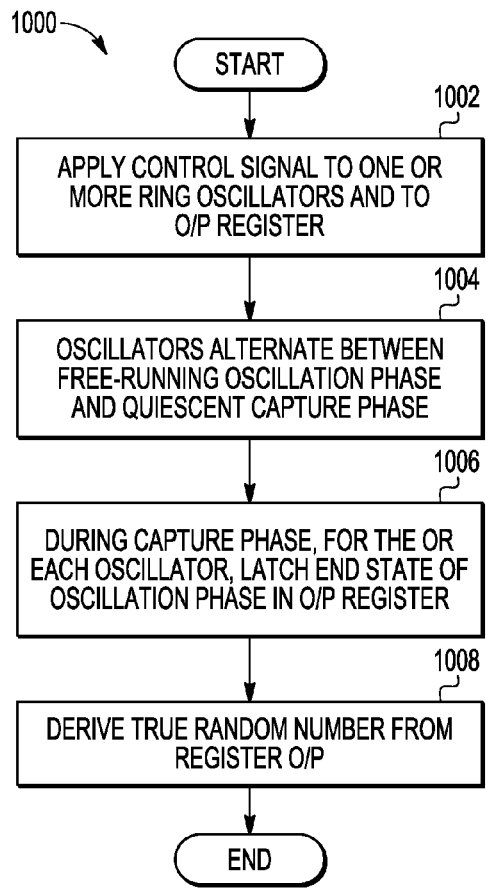
FIG. 10 is a flow chart of a method of generating a true random number in accordance with an embodiment of the present invention.
Figure 11:
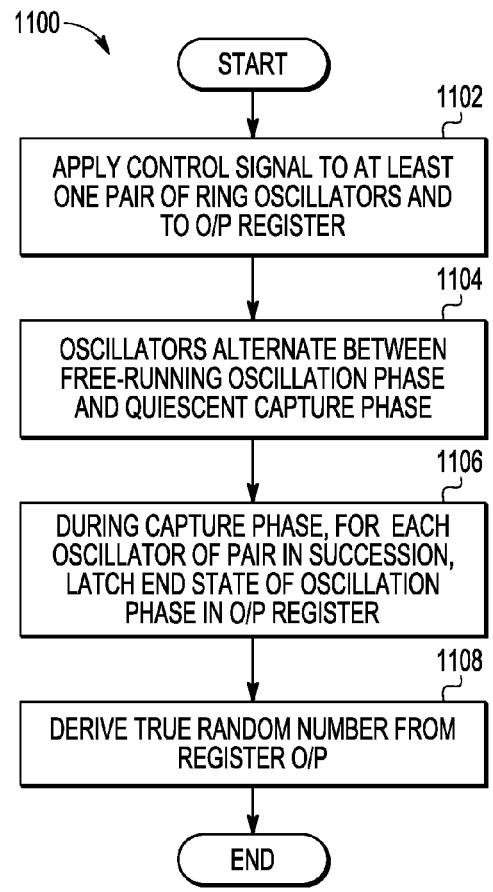
FIG. 11 is a flow chart of a method of generating a true random number in accordance with another embodiment of the present invention.

FIGS. 10 and 11 are flow charts illustrating methods 1000 and 1100 of generating a TRN in accordance with embodiments of the present invention. The methods 1000, 1100 includes activating one or more oscillators such as the oscillators 102, 104, 202, 204, 300, 702, 704 and 802 in, successively, a free-running oscillation phase and a capture phase during which the oscillator is quiescent, and latching in an output register 106, 706 during the capture phase of the or each oscillator 102 or 104, 202 or 204, 300, 702 or 704 and 802 an end state of that oscillator at or close to the end of its oscillation phase, and then deriving a TRN output from the latched end states.

Referring now to FIG. 10, the method 1000 includes at 1002 applying the control signal EN to one or more ring oscillators and to a signal processor such as 114 connected to an output register such as 106, 706. At 1004, the or each oscillator is activated to alternate between a free-running oscillation phase and a capture phase during which the oscillator is quiescent. During the capture phase of the or each oscillator, at 1006, the output register latches an end state of that oscillator at or close to the end of its oscillation phase. The TRN output is derived from the latched end states registered in the output register at 1008.

The method 1100 includes at 1102 applying a control signal EN to at least one pair of ring oscillators such as 102, 104, 202, 204, 300 and 702, 704 and to a signal processor such as 114 connected to an output register such as 106, 706. At 1104, the oscillators are activated successively to alternate between a free-running oscillation phase and a capture phase during which the oscillator is quiescent. During the capture phase of each oscillator in succession, at 1106, the output register latches an end state of that oscillator at or close to the end of its oscillation phase. The TRN output is derived from the latched end states stored in the output register at 1108.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed. Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, those skilled in the art will recognize that boundaries between the above described operations merely illustrative. Multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A true random number generator (TRNG), comprising:
   two or more oscillators; and
   an output register connected to the two or more oscillators for storing a random number output by the oscillators,
   wherein each of the oscillators is activated, successively, with a free-running oscillation phase and a capture phase during which the oscillator is quiescent, and
   wherein the output register latches during the capture phase of each oscillator an end state of that oscillator at or close to the end of its oscillation phase, and a random number is derived from the latched end states.

2. The TRNG of claim 1, wherein each of the two or more oscillators is a ring oscillator having an odd number of inverters connected in series between an oscillator input and an oscillator output, and a feedback loop from the oscillator output to the oscillator input.

3. The TRNG of claim 2, wherein the inverters are tri-state inverters having a high impedance during the capture phase.

4. The TRNG of claim 1, further comprising:
   a signal processor controlled by a control signal for latching the end states of the two or more oscillators and applying selected end states to the output register, and
   wherein the control signal controls the oscillation phases and the capture phases of the two or more oscillators.

5. The TRNG of claim 4, wherein the output register is a serial-input register, and the signal processor applies the latched end states of the two or more oscillators to the output register.

6. The TRNG of claim 5, wherein the two or more oscillators comprise a pair of oscillators, and the signal processor applies the latched end states of the oscillators of the pair alternately to the serial-input register.

7. The TRNG of claim 4, wherein the two or more oscillators comprise a plurality of oscillators, the output register comprises a parallel input register, and the signal processor applies the latched end states of the oscillators in parallel to the inputs of the parallel-input register.

8. The TRNG of claim 7, wherein the plurality of oscillators comprises a plurality of pairs of oscillators, wherein the signal processor applies the latched end states of the oscillators of each pair alternately to the respective parallel inputs of the output register.

9. A true random number generator (TRNG), comprising:
   at least one pair of oscillators; and
   an output register for storing a random number output,
   wherein each oscillator of the pair is activated in, successively, a free-running oscillation phase and a capture phase during which the oscillator is quiescent, and
   wherein the output register latches during the capture phase of each oscillator of the pair in succession an end state of that oscillator at or close to the end of its oscillation phase, and derives the random number output from the latched end states.

10. The TRNG of claim 9, wherein the oscillators are ring oscillators having an odd number of inverters connected in series between an oscillator input and an oscillator output, and a feedback loop from the oscillator output to the oscillator input.

11. The TRNG of claim 10, wherein the inverters are tri-state inverters presenting high impedance during the capture phase.

12. The TRNG of claim 9, further comprising:
   a signal processor connected between the oscillators and the output register, wherein a control signal controls the oscillation phases and the capture phases of the oscillators, and wherein the signal processor is controlled by the control signal for latching the end states of the oscillators and applying selected end states to the output register.

13. The TRNG of claim 12, wherein the output register is a serial-input register, and the signal processor applies the latched end states of the oscillators of the pair alternately to the serial-input register.

14. The TRNG of claim 12, wherein the at least one pair of oscillators comprises a plurality of pairs of oscillators, wherein the output register is a parallel-input register having a plurality of inputs, and the signal processor applies the latched end states of the oscillators in parallel to the inputs of the parallel-input register.

15. A method of generating a true random number (TRN) comprising:
   Activating two or more oscillators in, successively, a free-running oscillation phase, and a capture phase during which the oscillators are quiescent; and
   latching in an output register during the capture phase of each oscillator an end state of that oscillator at or close to the end of its oscillation phase, and deriving a TRN from the latched end states.

16. The method of claim 15, wherein each oscillator is a ring oscillator having an odd number of inverters connected in series between an oscillator input and an oscillator output, and a feedback loop from the oscillator output to the oscillator input.

17. The method of claim 16, wherein the inverters are tri-state inverters presenting high impedance during the capture phase.

18. The method of claim 15, wherein a control signal controls the oscillation phases and the capture phases of each oscillator, and wherein a signal processor controlled by the control signal latches the end states of the oscillators and applies selected end states to the output register.

19. The method of claim 18, wherein the two or more oscillators comprises at least one pair of the oscillators, wherein the output register is a serial-input register, and wherein the signal processor applies the latched end states of the oscillators of the pair alternately to the serial-input register.

20. The method of claim 18, wherein the output register is a parallel-input register having a plurality of inputs, and wherein the signal processor applies the latched end states of the two or more oscillators in parallel to the inputs of the parallel-input register.

\* \* \* \* \*